US006069018A

United States Patent [19]

Song et al.

[11] Patent Number: 6,069,018

[45] Date of Patent: May 30, 2000

[54] METHOD FOR MANUFACTURING A CATHODE TIP OF ELECTRIC FIELD EMISSION DEVICE

[75] Inventors: Yoon-Ho Song; Jin Ho Lee; Kyoung Ik Cho, all of Daejon, Rep. of Korea

[73] Assignee: Electronics and Telecommunications Research Institute, Daejon, Rep. of Korea

[21] Appl. No.: 09/141,121

[22] Filed: Aug. 27, 1998

[30] Foreign Application Priority Data

Nov. 6, 1997 [KR] Rep. of Korea ........................... 58524

[51] Int. Cl.$^{7}$ ........................ H01L 21/00

[52] U.S. Cl. ........................ 438/20; 313/309; 445/49; 445/50; 445/51

[58] Field of Search ........................ 438/20; 313/309; 445/49–51

[56] References Cited

U.S. PATENT DOCUMENTS

| | | | |
|---|---|---|---|
| 5,201,992 | 4/1993 | Marcus et al. | 156/643 |
| 5,302,238 | 4/1994 | Roe et al. | 156/643 |
| 5,358,908 | 10/1994 | Reinberg et al. | 437/228 |
| 5,420,054 | 5/1995 | Choi et al. | 437/38 |
| 5,532,177 | 7/1996 | Cathey | 437/40 |

OTHER PUBLICATIONS

R.B. Marcus et al., Formation of silicon tips with >Inm radius, Jan. 15, 1990, pp. 236–238.

McGruer et al., Oxidation Sharpened Grated Field Emitter Array Process, Oct. 1991, pp. 2389–2391.

E.C. Boswell et al., Polycrystalline Silicon Field Emitters, 1995, Jul., pp. 181–185.

*Primary Examiner*—John F. Niebling
*Assistant Examiner*—David A Zarneke
*Attorney, Agent, or Firm*—Cohen, Pontani, Lieberman & Pavane

[57] ABSTRACT

A method for manufacturing a cathode tip of electric field emission device includes depositing conductive layer and undoped silicon layer on the insulator substrate sequentially; forming a tip-mask pattern on the selected area of top of said undoped silicon film and etching said undoped silicon film isotropically and then anisotropically in turn, so that the silicon film is formed as cone-like having cylinder; and removing the tip-mask pattern, implanting ion into the etched silicon layer and removing the ion implanted silicon layer using the wet etch process.

5 Claims, 4 Drawing Sheets

METHOD FOR MANUFACTURING A CATHODE TIP OF ELECTRIC FIELD EMISSION DEVICE

BACKGROUND OF THE INVENTION

1. Field of the Invention

This invention relates to a method for manufacturing of a semiconductor electric field emission device and, more particularly, relates to a method for manufacturing of a cathode tip which emits electrons by the electric field applied.

2. Description of the Related Art

The electric field emission device is one of the electron source devices and causes the cathode tip of it to emit electrons when it is applied by the electric field in the vacuum or other special atmosphere. Such a device can be used as an electron source device for the microwave devices, sensors, flat panel displays etc.

In the electric field emission devices, the efficiency of the electron emission, in large, depends on the structure of the device, the material and the shape of cathode emitter. The structure of electric field emission device used at present is largely classified into diode type constructed as a cathode and an anode, and triode type constructed as a cathode, a gate and an anode. The triode type can be driven at a lower voltage in comparison with the diode type since the electric field for emitting electrons is applied to the gate which is near the cathode. Also, it is easy to control the emission current with the gate as well as the anode. Therefore, the trend at present is to develop triode type of field emission device. The cathode materials include metal, silicon, diamond and diamond like carbon etc., and in the case of using the silicon among them, there is a merit in which the semiconductor process can be used to manufacture the devices and the electric field emission devices can be manufactured compatibly with the integrated circuit process. The cathode tip has a conic shape in its end in order to induce as large electric field as possible under the voltage applied.

FIGS. 1*a* to 1*e* show cross-sectional views which explain a method for manufacturing cathode tip of electric emission device by the conventional art.

As can be seen in FIG. 1*a*, a N-type well 12A is formed through ion implantation process in a selected area on the semiconductor substrate 11 such as P-type silicon wafer.

FIG. 1*b* is the cross-sectional view which shows the formation of tip-mask pattern 13. The tip-mask pattern is formed through the photolithography and etching process after depositing nitride film on the N-type well 12A. Here, an oxide film may be used instead of the nitride film.

FIG. 1*c* is the cross-sectional view which shows a shape after etching the semiconductor substrate 11 together with the N-type well 12A isotropically, using the nitride tip-mask 13 as an etching mask. As shown in the figure, a portion of the N-type silicon well 12A under the nitride tip-mask 13 is etched, and therefore, a cone-like shape of silicon 12B is formed. Thereafter, thermal oxidation process is performed on the entire structure, as seen in FIG. 1*d*. This process is performed at high temperature over 800° C. Therefore, the oxide film 12C is formed on the surface of semiconductor substrate 11 and on the surface of cone shaped silicon 12B.

FIG. 1*e* is a cross-sectional view which shows cone shaped silicon 12B after removing the nitride tip-mask 13, and oxide film 12C which was formed through thermal oxidation process sequentially. The remaining part of silicon 12B after thermal oxidation process forms a cathode tip 14 whose shape is cone, and is pointed at the end.

The triode type of electric field emission device can be completed by forming a gate insulator film (not shown) and a gate (not shown) around the cathode tip and by forming an anode on the other new substrate.

The electric field emission device produced in the above process has a merit that the process is simple and the cathode tip is pointed at the end. However, it has a problem that the shape of cathode tip 14 can be seriously changed in accordance with the process condition. Moreover, it has another problem that a cheap and large-area material such as glass can not be used as a substrate since the process is performed at a high temperature.

SUMMARY OF THE INVENTION

It is an object of the present invention to provide a method for manufacturing a cathode tip which is cheap and uniform in its shape.

The method for manufacturing a cathode tip includes steps of depositing conductive layer and undoped silicon layer on the insulator substrate sequentially; forming a tip-mask pattern on the selected area of top of said undoped silicon film and etching said undoped silicon film isotropically and then anisotropically in turn, so that the silicon film is formed as cone-like having cylinder; and removing the tip-mask pattern, implanting ion into the etched undoped silicon layer and removing the ion implanted silicon layer using the wet etch process.

The above and further objects, aspects and novel features of the invention will become more apparent from the following detailed description when read in connection with the accompanying drawings.

DESCRIPTION OF THE PREFERRED EMBODIMENT

Figure 1A:
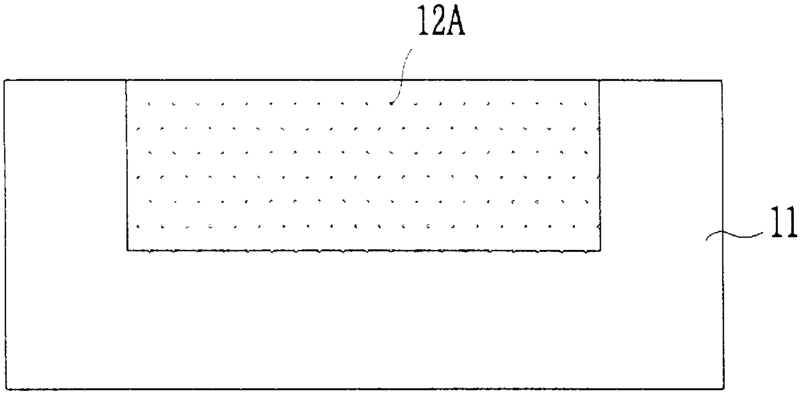
FIG. 1*a* to 1*e* show cross-sectional views which explain a method for manufacturing cathode tip of electric emission device of the conventional art.
Figure 1B:
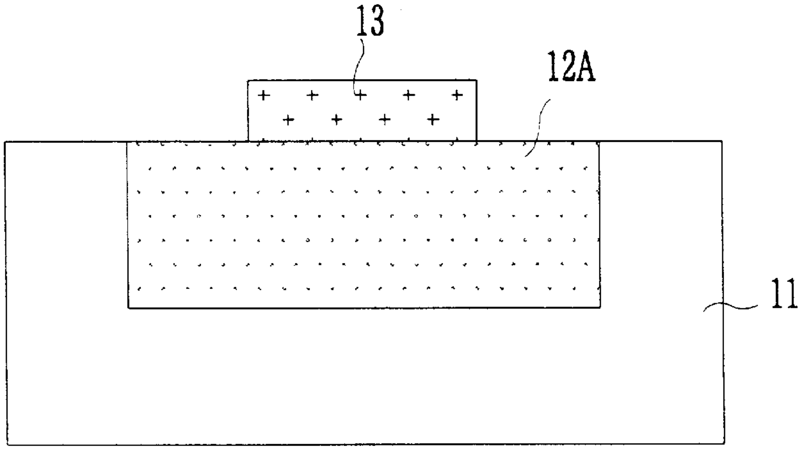
Figure 1C:
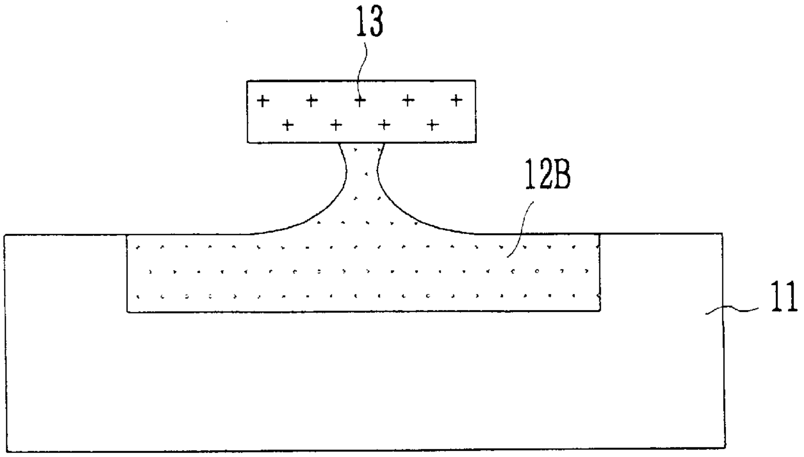
Figure 1D:
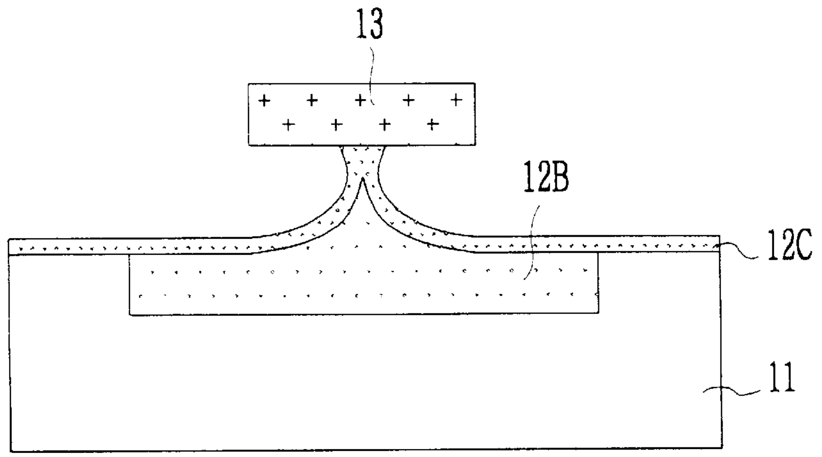
Figure 1E:
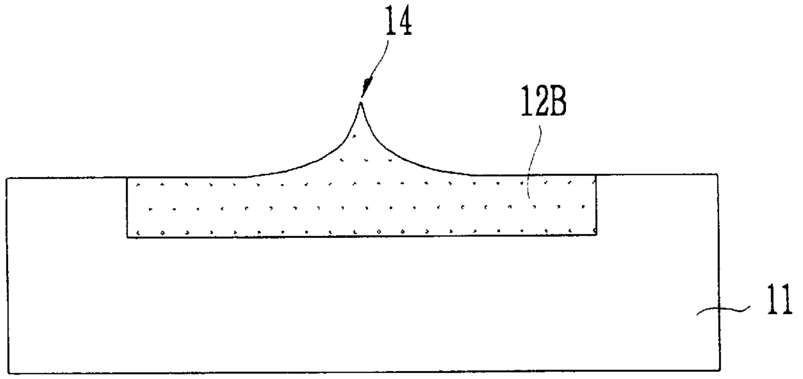
Figure 2A:
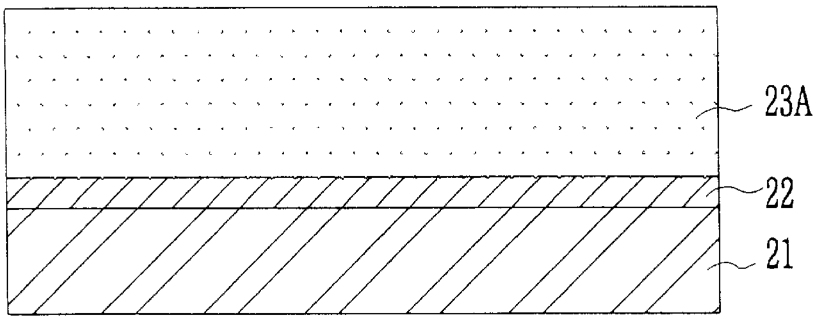
FIG. 2*a* to 2*e* show cross-sectional views which explain a method for manufacturing cathode tip of electric emission device of the invention.

First, as shown in FIG. 2*a*, a conductive layer 22 and an undoped silicon layer 23A are deposited sequentially on the insulator substrate 21. Here, the insulator substrate 21 can be an oxide film, a tip-mask, a quartz or glass etc., and the conductive layer 22 can be metal, alloy, ion implanted silicon etc. The undoped silicon layer 23A is intrinsic silicon deposited by using one of low pressure chemical vapor deposition, plasma enhanced chemical vapor deposition and sputtering methods.

Figure 2B:
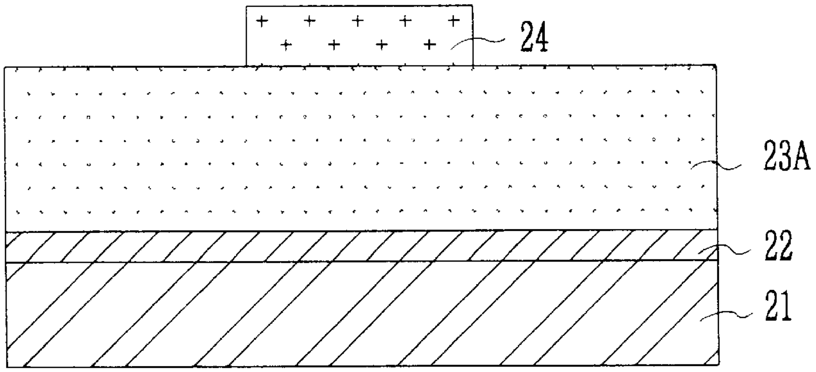

FIG. 2*b* is the cross-sectional view which shows a tip-mask pattern 24 formed using photolithography and etching process, after depositing tip-mask 24 on the undoped silicon layer 23A. Here, oxide film may be used instead of the tip-mask.

Figure 2C:
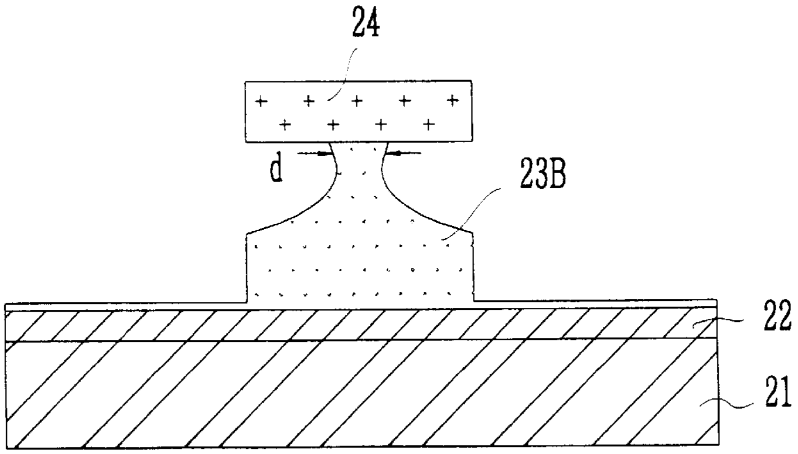

Thereafter, the silicon layer 23A is etched in two steps using the tip-mask pattern 24 as an etching mask. That is, the silicon layer 23A is etched isotropically at first, and then it is etched anisotropically. The resultant shape of the silicon layer 23A is cone-like including cylinder, as shown in FIG. 2*c*.

Figure 2D:
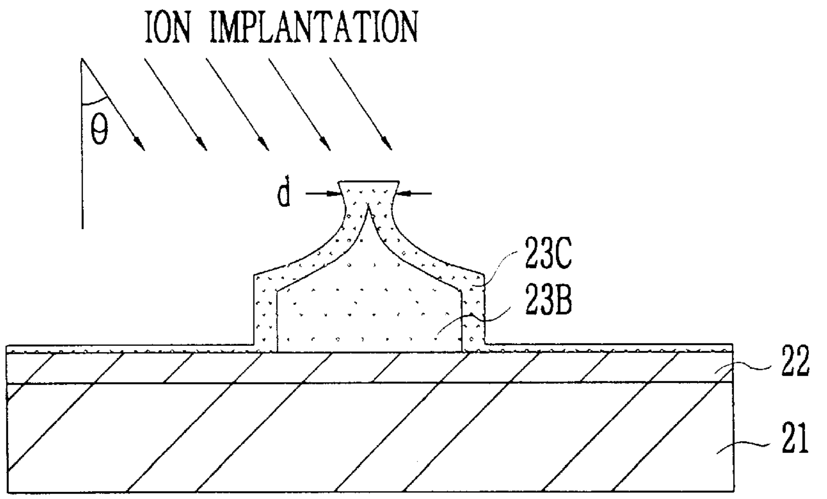

FIG. 2*d* is the cross-sectional view in which ion implantation process was performed after removing the tip-mask 24 using the wet etching process. Here, the impurity for ion implantation can be Phosphorus (P), Arsenic (As), Boron (B) etc, and the substrate can be rotated in order to implant the impurity isotropically when implanting the ion. The condition of ion implantation is as follows, $$(L\ X \sin \theta))(d/2)$$

wherein L is the projected range of the impurity in the silicon 23B when implanting the ion, θ is an angle between ion beam of the impurity and normal of substrate, and d is the diameter of the narrowest part of the top of conical silicon 23B after removing the tip-mask 24. Using such an ion implantation process, doped silicon layer 23C of a desired thickness is formed on the surface of silicon 23B.

Figure 2E:
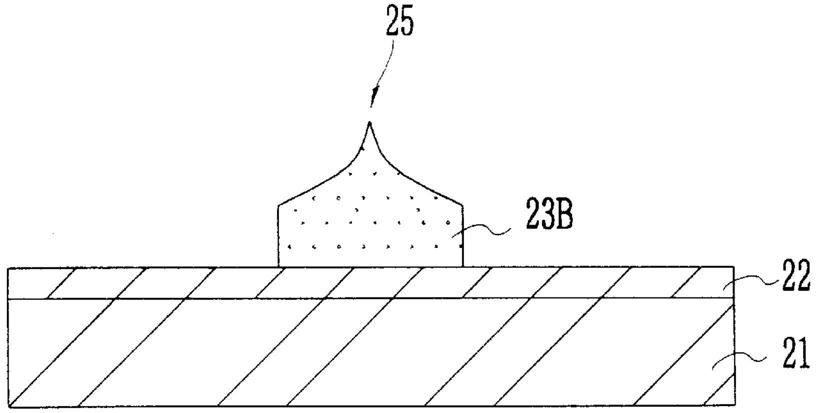

As shown in FIG. 2*e*, the conical cathode tip 25 which is pointed at the end can be obtained by wet-etching ion implanted silicon layer 23C. Here, the wet etch is performed using the solution mixed with HF, $CH_3COOH$ and $HNO_3$. The cathode tip 25 becomes clean and smart in its shape because the solution causes the ion implanted silicon layer 23C to be etched in a high etching rate and the undoped silicon layer 23B to be etched in a low etching rate.

The cathode tip produced in the above process can be used in both diode type electric field emission device and triode type electric field emission devices. All processes in this manufacturing method can be performed under the temperature of 600° C., and they can be compatible with the manufacturing process of semiconductor integrated circuit.

According to the invention described above, the cathode tip can be produced stably and uniformly since the ion implanted silicon is etched selectively, and cheap materials such as glass can be used as substrate since this method does not use the thermal oxidization process.

What is claimed is:

1. A method for manufacturing a cathode tip of an electric field emission device, comprising the steps of:

sequentially depositing a conductive layer and an undoped silicon layer on an insulator substrate;

forming a tip-mask pattern on a selected portion of said undoped silicon layer;

sequentially performing an isotropic etching process and an anisotropic etching process so that said undoped silicon layer is etched into a cone-like shape;

removing said tip-mask pattern;

implanting impurity ions into a portion of said undoped silicon layer; and removing the ion implanted silicon layer by means of a wet etching process.

2. The method as claimed in claim 1, wherein said insulator substrate comprises one of the group consisting essentially of oxide film, tip-mask, quartz and glass.

3. The method as claimed in claim 1, in which the substrate is rotated during the ion implantation process in order to implant the ion into the silicon layer isotropically.

4. The method as claimed in claim 1, in which the impurity ion used in the ion implantation process comprises one of the group consisting essentially of phosphorus, arsenic, and boron.

5. The method as claimed in claim 1, in which a solution used in the wet etch process is a solution mixed with HF, $CH_3COOH$ and $HNO_3$.

* * * * *